United States Patent [19]

Ferrara

[11] 4,011,503
[45] Mar. 8, 1977

[54] APPARATUS FOR MEASURING THE PHASE RELATION OF TWO ALTERNATING CURRENT SIGNALS

[75] Inventor: John M. Ferrara, Yardley, Pa.

[73] Assignee: Narco Scientific Industries, Inc., Fort Washington, Pa.

[22] Filed: Oct. 16, 1975

[21] Appl. No.: 622,842

[52] U.S. Cl. .......................... 324/83 R; 324/83 D; 307/232; 307/251

[51] Int. Cl.² .................. H03D 13/00; G01R 25/00

[58] Field of Search .......... 328/109, 110; 307/232, 307/251; 324/83 A, 83 R, 83 D; 330/30 D

[56] References Cited

UNITED STATES PATENTS

| | | | |
|---|---|---|---|
| 3,281,846 | 10/1966 | King | 324/83 A |
| 3,386,041 | 5/1968 | Bell | 307/232 X |
| 3,456,128 | 7/1969 | Myers | 330/30 D |
| 3,524,075 | 8/1970 | Matthews et al. | 307/232 X |
| 3,591,854 | 7/1971 | Cole | 307/232 |
| 3,668,543 | 6/1972 | Bailey | 330/30 D |
| 3,940,693 | 2/1976 | Brown | 324/83 A |

Primary Examiner—John S. Heyman
Attorney, Agent, or Firm—Paul & Paul

[57] ABSTRACT

A known reference signal is applied to a zero crossing detector and normal and inverted outputs from the zero crossing detector are applied to the input control terminals of a pair of bilateral switches. A measured signal of the same frequency but not necessarily of the same phase is simultaneously applied to the input terminals of the bilateral switches. The resultant output of the bilateral switches is connected to a parallel RC network. The capacitor acquires a charge proportional to the deviation from 90°, which is applied to a differential amplifier. The output of the differential amplifier is used to drive a meter which indicates the phase relationship of the two signals. The capacitor used to accumulate the net charge is ungrounded to eliminate errors resulting from unequal currents to ground.

1 Claim, 4 Drawing Figures

APPARATUS FOR MEASURING THE PHASE RELATION OF TWO ALTERNATING CURRENT SIGNALS

BACKGROUND OF THE INVENTION

This invention relates generally to signal measurement and more particularly to the measurement of the phase difference between a known reference signal and a signal to be measured.

Many prior art devices have been developed to perform measurements of the type made by this invention. A typical known circuit is disclosed in U.S. Pat. No. 3,591,854 to Cole, but the prior art has evidenced several operational deficiencies. For example, the Cole disclosure teaches the use of a circuit employing grounded capacitors. This configuration results in erroneous indications of phase measurement unless the time constants of both legs of the circuit are equal. Various harmonic components contained in the signals to be measured can also produce an error because the capacitors are grounded. Circuits configured as in Cole further require the use of carefully matched resistors and capacitors to achieve the symmetry necessary for accurate phase measurement. Further, the use of the zero crossing detector in conjunction with an adjustable impedance that works in association with the operational amplifier provides a particularly stable and accurate phase measurement system.

SUMMARY OF THE INVENTION

A reference signal is applied to the input terminals of a zero crossing detector. The output square-wave signal of the zero crossing detector is applied to the control terminal of one bilateral switch and through an inverter, to the control terminals of another bilateral switch. A signal to be measured is applied to the input terminals of both bilateral switches. The output from the two bilateral switches is applied across a parallel RC network. The net charge required across the capacitor is a function of the phase relationship of the two signals. The two sides of the capacitor are connected to the input terminals of an operational amplifier. The voltage output from the operational amplifier is a function of the differential in voltage measured across the capacitor. The output from the operational amplifier is used to drive a meter, which indicates the phase relationship of the two signals applied to the circuit. Adjustable resistive networks used in conjunction with the operational amplifier insure an accurate measurement of phase. The circuit employs a single common charging capacitor, to insure accurate phase measurement without the necessity of balancing the RC time constants of the two charging circuits.

Accordingly, it is the primary object of this invention to provide an apparatus for accurately and simply measuring the phase relationship between two alternating current signals.

It is another object of this invention to provide a phase measuring apparatus which will function accurately when one or both of the signals to be measured contain harmonics, or a DC level bias voltage.

It is another object of this invention to provide a phase measurement circuit which can easily be adjusted to provide extremely accurate measurements of the phase relationship of two alternating current signals.

These and other objects of the invention can be readily ascertained by reference to the appended description and figures.

DESCRIPTION OF THE PREFERRED EMBODIMENT

Figure 1:
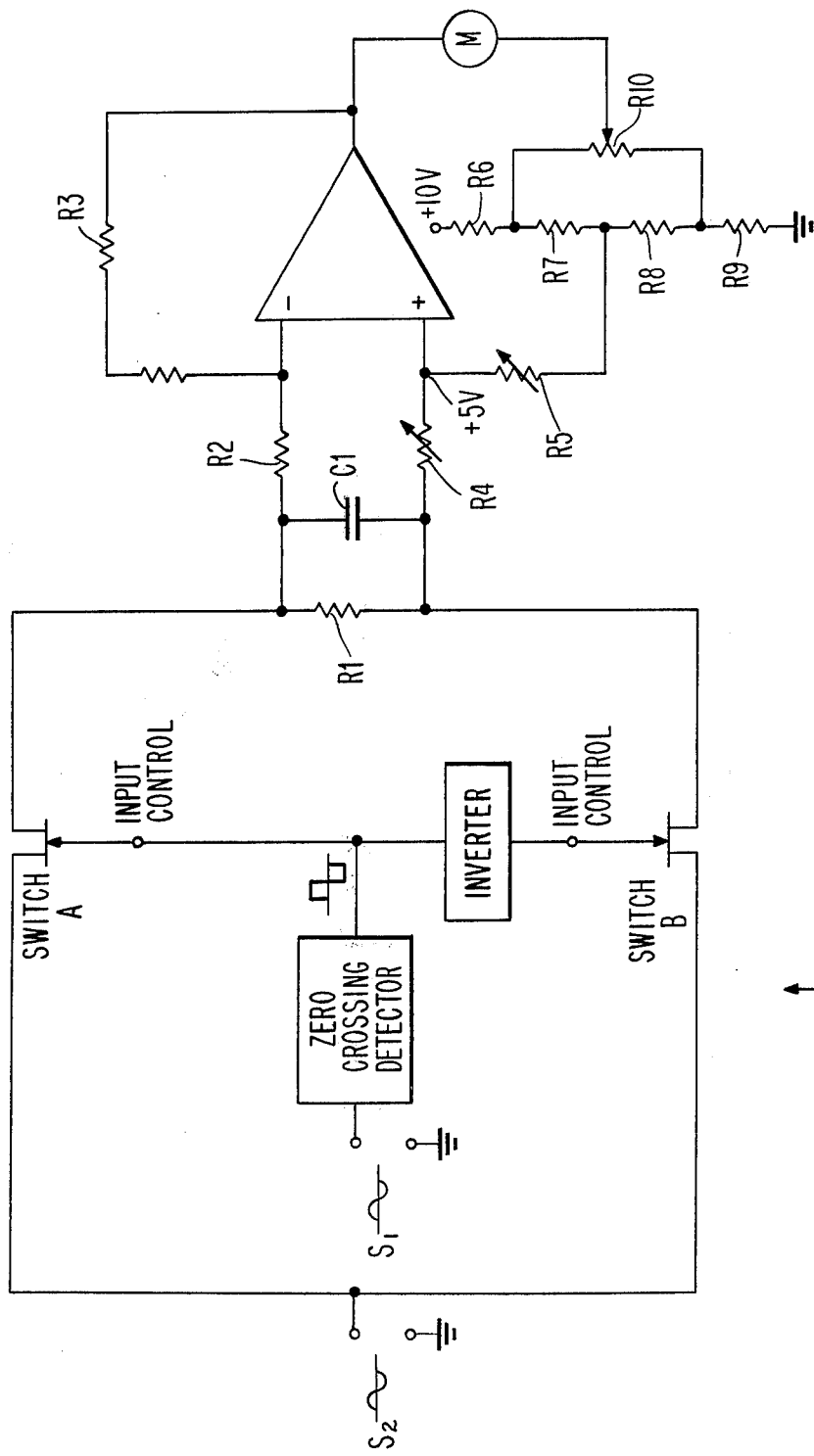
FIG. 1 is a schematic drawing of the invention.
Figure 2:
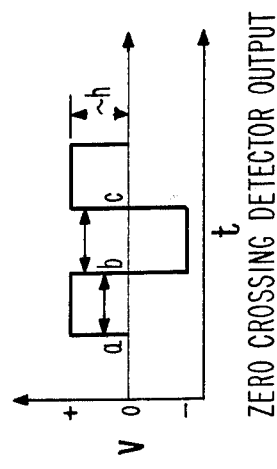
FIG. 2 is a representation of the output signal from the zero crossing detector.

A schematic diagram of a preferred embodiment for the subject invention is shown in FIG. 1. The reference signal ($S_1$) is applied to the input terminals of the zero crossing detector. The output of the zero crossing detector is a square wave as illustrated in FIG. 2. The output square wave from the zero crossing detector is used to operate switches A and B. As shown in FIG. 2, the heighth H of the square wave represents a voltage sufficient to operate switches A and B.

The reference signal is applied to the zero crossing detector because it is important that the resultant square wave by symmetrical as shown in FIG. 2. That is, the distance AB should equal the distance BC so that switches A and B are on and off for equal amounts of time. If the input signal contained various transient spikes riding impressed upon the signal an error could be introduced into the circuit, because of the AB, BC symmetry discussed above. Accordingly, the "cleanest" signal of the two to be measured is used as a reference and is applied to the input terminals of the zero crossing detector.

Switches A and B are "on" when a positive voltage is applied to the input control terminals. When switch A is on, input signal $S_2$ is applied across capacitor $C_1$ shunted by resistance $R_1$ through $R_4$ and the Op Amp input. When switch B is on, input signal $S_2$ is also applied across capacitor $C_1$ shunted by $R_1$, through $R_2$, but with an opposite polarity.

Figure 3A:
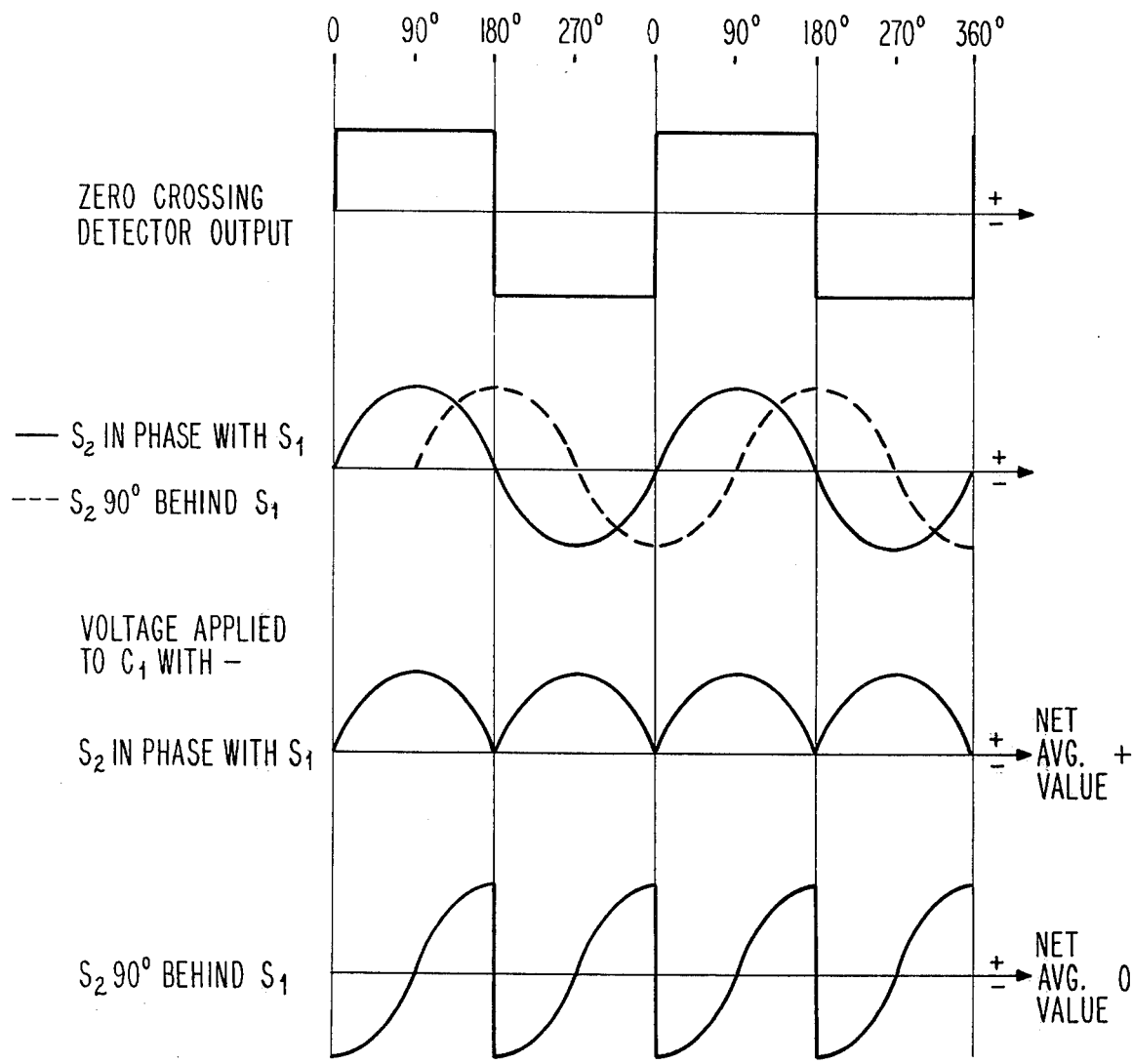
FIG. 3 is a representation of the net voltage applied to the charging capacitor for various signal phase relationships.
Figure 3B:
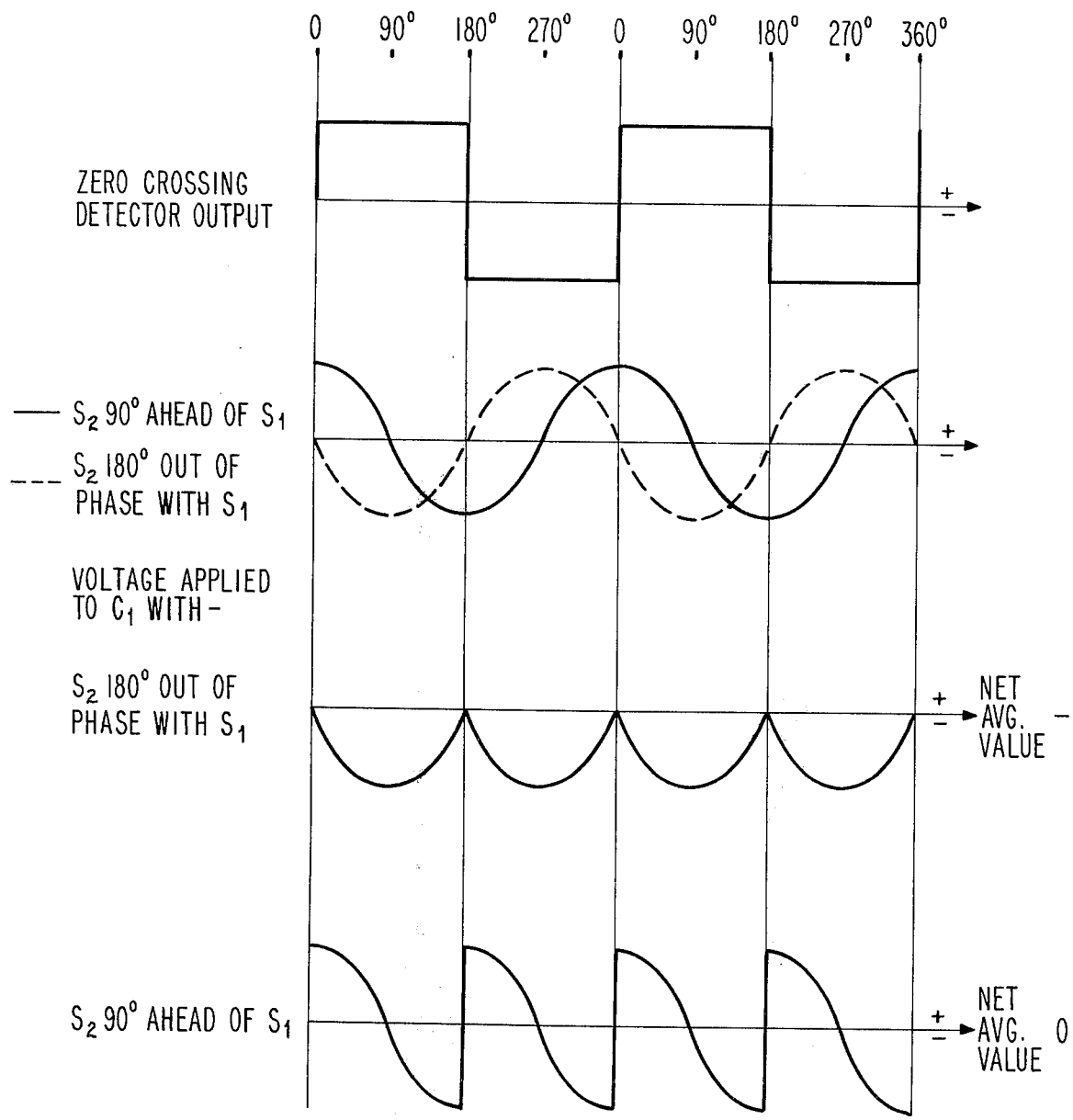

FIG. 3 illustrates the effect of the application of the two signals to the circuit as shown. For purposes of illustration, the reference signal output from the zero crossing detector is held constant as illustrated. The input signal to be measured $S_2$ is shown in four different phase relationships to the reference signal.

When $S_2$ is in phase with $S_1$, the voltage applied to $C_1$ is as illustrated. The square wave holds switch A open and switch B closed during the first half cycle of input signal $S_2$. The square wave then holds switch A closed and switch B open during the next 180° of input from $S_2$. The resultant voltage applied to $C_1$ is as illustrated in FIG. 3. Note that this resultant voltage has some positive net average value which is the value to which capacitor $C_1$ will become charged.

When $S_2$ is 90° behind $S_1$, the voltage applied to $C_1$ is as illustrated. Note that the net average value applied across the capacitor in this instance is zero volts.

When $S_2$ is 180° out of phase with $S_1$ a net average value of some negative quantity is applied across capacitor $C_1$ as illustrated.

When $S_2$ is 90° ahead of $S_1$, the average value of the voltage applied across $C_1$ is again zero as illustrated.

As has been described, a net average voltage is stored in capacitor $C_1$, depending upon the phase relationship of input signals $S_1$ and $S_2$. Capacitor $C_1$ is not referenced to ground directly; accordingly, if a bias DC level is inherent in input signal $S_2$, this DC level will be applied first on one side of the capacitor $C_1$ and then in the opposite direction across the capacitor $C_1$ in such a manner that it effectively cancels out. Harmonic components contained in input signal $S_2$ are similarly canceled.

Earlier phase detectors of this type such as the circuit disclosed by Cole in U.S. Pat. No. 3,591,854 have employed two separate RC networks to store the net charge related to the phase difference between the two signals being measured. This created problems, obviated by the novel design of this new invention. Specifically, in the earlier design, each RC network had to be identical to provide the symmetry necessary to an accurate phase determination. If not identical, it was at least necessary to make the RC time constant very large to smooth out any ripple in the signal. This was undesirable because other design considerations are affected by the choice of a time constant for this circuit. In the present invention, the use of parallel RC ungrounded charging networks eliminates the problems associated with earlier circuits.

The net charge developed across capacitor $C_1$ is applied to the input terminals of the operational amplifier. A reference voltage of 5 volts is applied to one leg of the operational amplifier as shown. If the reference voltage should vary, the output of the operational amplifier follows it, with the result that there is no error in phase measurement. The meter, which is used to indicate the phase relationship between the two input signals is connected through a potentiometer to the reference voltage. The potentiometer allows a very fine adjustment of the reference voltage to the meter to insure that it reads accurately. The values of resistances, $R_2$ and $R_3$, and resistances, $R_4$ and $R_5$, are such that the meter does not load down and effect the phase detection circuitry.

The following procedure can be used to achieve very fine phase measurement accuracy with the disclosed circuit.

Step 1. Short around capacitor $C_1$ — This insures that there is no input signal to the operational amplifier.

Step 2. Adjust potentiometer $R_{10}$ so that the meter reads zero.

Step 3. Remove the short around capacitor $C_1$, apply signal $S_1$ to the zero crossing detector, and a signal $S_2$, whose DC level can be varied to the other input terminals.

Step 4. Adjust resistor $R_4$ such that the voltage across $C_1$ does not change as the DC level of signal $S_2$ is varied. This adjustment assures that resistance $R_2$ and $R_4$ are exactly equal.

Step 5. Adjust resistance $R_5$ such that the meter does not move as the DC level applied to $S_2$ is varied. This adjustment assures that $R_3$ is exactly equal to $R_5$.

After the circuit has been adjusted as described above, it is capable of extremely precise phase measurement determinations between two signals.

The foregoing discussion and the accompanying drawings are intended as illustrative, but are not to be construed as limiting. Still other variations within the spirit and scope of this invention will readily present themselves to one skilled in the art.

What is claimed is:

1. A circuit for measuring the difference in phase between first and second alternating signals of the same frequency comprising:
   a. first and second bilateral switches each having an input control terminal, an input terminal, and an output terminal;
   b. an input terminal for the first signal connected to a zero crossing detector;
   c. an inverter connecting the output of the zero crossing detector to the input control terminal of the first bilateral switch;
   d. a connection between the output of the zero crossing detector and the input control terminal of the second bilateral switch;
   e. an input terminal for receiving the second signal connected to each input terminal of the first and second bilateral switches;
   f. charge storage means comprising a resistance and a capacitance connected in parallel between the two output terminals of the bilateral switches whereby the net average charge resulting from the application of said first and second signals to the circuit is stored as an indication of the phase relationship of said first and second signals;
   g. an operational amplifier connected to said charge storage means adapted to provide an output signal proportional to the charge contained in said storage means, wherein variable resistances ($R_4$ and $R_5$) are connected to an input terminal of the operational amplifier to allow the circuit to be adjusted so that a bias level DC voltage in the measured signal will not produce a phase measurement error;
   h. meter means operatively connected to the output of the operational amplifier to provide an indication of the phase relationship of the two signals.

* * * * *